(12) United States Patent
Chen et al.

(10) Patent No.: US 7,268,575 B1
(45) Date of Patent: Sep. 11, 2007

(54) METHOD OF NBTI PREDICTION

(75) Inventors: Chia-Lin Chen, Jhubei (TW); Ming-Chen Chen, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/278,827

(22) Filed: Apr. 6, 2006

(51) Int. Cl.
G01R 31/26 (2006.01)
(52) U.S. Cl. .................. 324/769; 324/765; 324/766
(58) Field of Classification Search ........ 324/760–769; 702/108–183
See application file for complete search history.

(56) References Cited

U.S. PATENT DOCUMENTS

| | | | |
|---|---|---|---|
| 6,456,104 B1 | 9/2002 | Guarin et al. | |
| 6,521,469 B1 | 2/2003 | La Rosa et al. | |
| 6,731,179 B2 | 5/2004 | Abadeer et al. | |
| 6,815,970 B2 * | 11/2004 | Rost et al. | 324/765 |
| 2003/0233624 A1 | 12/2003 | Reddy et al. | |
| 2004/0073412 A1 * | 4/2004 | Walker et al. | 703/2 |
| 2005/0278677 A1 | 12/2005 | Ang et al. | |

OTHER PUBLICATIONS

G. Chen et al., "Dynamic NBTI of PMOS Transistors and ITS Impact on Device Lifetime", at www.ece.nus. edu.sg/stfpage/elelimf/pub(update-Nov. 20, 2004) 16%20Chen%20DNBIT%20IRPS%202003%20 Jan.pdf on Jan. 2003, 7 pages.
Erhong Li et al., "Plasma-Induced Charge Damage and its Effect on Reliability in 0.115- um Technology", 2003 IEEE, pp. 69-72.
Cadence, "Reliability Simulation in Integrated Circuit Design", Published Dec. 2003, 11 pages.
Schroder et al., "Negative bias temperature instability: Road to cross in deep submicron silicon semiconductor manufacturing", 2003 American Institute of Physics, Journal of Applied Physica, vol. 94, No. 1, Applied Physics Reviews—Focused Review, pp. 1-18.
H. Aono et al., "Modeling of NBTI Degradation and Its Impact on Electric Field Dependence of the Lifetime", IEEE 04CH37533, 42nd Annual International Reliability Physica Symposium, Phoenix, 2004, pp. 23-27.
"Thin Gate Oxide Device PMOS HCI Reliability and NBTI Effect Correlation", Sep. 28, 2005 at www.paper.edu.cn/ztlw/download.jsp?file-Agilent C-05.

(Continued)

*Primary Examiner*—Shuwang Liu
*Assistant Examiner*—Christopher Von Benken
(74) *Attorney, Agent, or Firm*—Duane Morris LLP; Steven E. Koffs

(57) ABSTRACT

A method includes measuring a gate leakage current of at least one transistor. A single stress bias voltage is applied to the at least one transistor at a given temperature for a stress period t. The stress bias voltage causes a 10% degradation in a drive current of the transistor at the given temperature within the stress period t. A negative bias temperature instability (NBTI) lifetime τ of the transistor is estimated based on the measured gate leakage current and a relationship between drive current degradation and time observed during the applying step.

20 Claims, 6 Drawing Sheets

OTHER PUBLICATIONS

K. Watanabe et al., "New NBTI Lifetime Prediction Method for Ultra Thin SiO2 Films", May 23, 2005 at http:llecsmeetz.peerxpress.org/ms-files/ecsmeetz/2005/05/23 100006000/00/6000-0-art-file-o-1117206973-cnv.pdf, 1 page.

Stol Semiconductor Technology Online, "Fostering Synergy for the Advancement: of Semiconductor Technology", at http://www.semitechonline.com/realiability.html, published Nov. 2004, pp. 1-3.

K. Ohgata et al, Universality of Power-Law Voltage dependence for TDDB Lifetime in Thin Gate Oxide PMSOSFETs, IEEE 05CH37616, 43rd Annual International Reliability Physics Symposium, San Jose, 2005.

G. Chen et al., "Dynamic NBTI of p-MOS Transistors and Its Impact on MOSFET Scaling", IEEE Electron Device Letters, 2002 IEEE, pp. 1-3.

Semiconductor Interantional—Conference Report: Plasma and Plasma-Induced Damage 2 . . . , at http://www.reed-electronics.com/semiconductor/article/CA312641?pubdate=7%2F1%2F2 . . . , Jan. 18, 2006.

* cited by examiner

METHOD OF NBTI PREDICTION

FIELD OF THE INVENTION

The present invention relates to semiconductor devices generally, and more specifically to prediction of Negative Bias Temperature Instability (NBTI) lifetimes in semiconductor devices.

BACKGROUND

Negative Bias Temperature Instability (NBTI) is a device degradation mechanism identified in sub-100 nm MOSFETs. When the gate of a P-MOSFET is negatively biased at an elevated temperature, oxide interface traps are generated due to an interaction of holes in the channel inversion layer with gate oxide. The instability is measured as an increase in the magnitude of the threshold voltage of the device. Higher stress temperatures produce more degradation. The mechanism is known to cause reliability performance degradation for the PFET because of this change in threshold voltage. NBTI also results in degradation of transistor drive current for any given drive voltage. NBTI becomes a serious concern for 90 nm technology and beyond, and its effect increases exponentially with decreasing gate oxide thickness.

The term "NBTI lifetime" refers to the period in which the drive current of a transistor at a given drive voltage decreases by 10% from its original value due to NBTI degradation. A transistor that has decreased current output by 10% can have sufficient impact on circuit timing to cause the circuit to fail to perform its intended function, and is thus at the end of its useful life.

A variety of publications have dealt with characteristics, behavior and physics of the NBTI mechanism. Several models have been developed to predict the NBTI lifetime for a given transistor, or circuit containing one or more transistors. NBTI lifetime prediction may in turn be used as part of the system design process, or as part of a qualification procedure for a lot of semiconductor products.

A known NBTI prediction method includes testing transistors at a plurality of different stress voltages (e.g., four different stress voltages) at elevated temperature for a given stress period (e.g., one day at each stress voltage). The transistor drive current at each voltage is monitored throughout the testing. The stress period is long enough so that the drive current of the transistor subjected to the highest stress voltage is reduced by 10%. The transistors subjected to lower stress voltages do not reach 10% degradation during the testing (stress) period, so the amount of time for 10% degradation to occur at each of the lower stress voltages is estimated by extrapolation, based on the drive current degradation measured at each respective stress voltage.

FIG. 1 shows an example in which two different stress voltages are used. The NBTI degradation can be characterized by:

$$\Delta Id/Id \sim t^n, \quad (1)$$

where Id is the drive current, t is the length of time the stress voltage is applied, and n is a parameter referred to herein as the degradation slope.

At a stress voltage level of −2.0V, the transistor reaches 10% degradation, and the stress testing period is then ended. During the same stress period, the transistor subjected to −1.4 V does not reach 10% degradation, so the length of time to reach 10% degradation at 1.4 V is estimated by extrapolation. As shown in FIG. 1, the extrapolated estimate of stress time for the −1.4 V stress voltage can differ substantially depending on whether the extrapolation is based on the full range of measured degradation values, or only on the last five points measured.

There has been controversy regarding these models and the selection of data points to be used in the models. For example, consider a first sample including the full range of drive current data points collected throughout the stress period at one of the lower voltages, such that drive current degradation during the stress period is less than 10%. Also consider a second sample including only a subset of the same data in the first sample (e.g., the five most recently collected drive current data points at the end of the stress period). Using a conventional NBTI model, the predicted NBTI based on the first sample may differ from the predicted NBTI based on the second sample (because of the extrapolation used to determine the stress time for the lower voltage levels). For example, the predicted NBTI based on the full range of data from the first sample may be substantially shorter than the predicted NBTI based on the subset of data in the second sample.

FIG. 2 shows an example of NBTI predictions based on stress testing at four different stress voltages: −1.1, −1.55, −1.7 and −1.85 Volts. The line indicated by ellipses is based on the stress time extrapolated based on the full range of test data. The line indicated by squares is based on the stress time extrapolated based on the last five test data. The results based on the full data range at each stress voltage predict a shorter NBTI lifetime than the results based on the last five data points at each stress voltage.

Neither the extrapolation based on the full range of sample selection or the extrapolation based on the last-five-points has achieved universal acceptance.

A model that underestimates the NBTI lifetime is troublesome, because it causes over-design of circuits and increases the cost of products that are required to last for a given specified product life.

SUMMARY OF THE INVENTION

In some embodiments, a method includes measuring a gate leakage current of at least one transistor. A single stress bias voltage is applied to the at least one transistor at a given temperature for a stress period t. The stress bias voltage causes a 10% degradation in a drive current of the transistor at the given temperature within the stress period t. A negative bias temperature instability (NBTI) lifetime τ of the transistor is estimated based on the measured gate leakage current and a relationship between drive current degradation and time observed during the applying step.

In some embodiments, a method includes dividing a gate leakage current of at least one transistor by a corresponding gate voltage of the transistor to determine a ratio s. A single stress bias voltage is applied to the at least one transistor at a given temperature for a stress period t. The stress bias voltage is sufficiently high to cause a 10% degradation in a drive current of the transistor at the given temperature within the stress period t. A degradation slope n is determined, such that a change in the drive current of the transistor due to application of the single stress bias voltage is proportional to $t^n$. A negative bias temperature instability (NBTI) lifetime τ of the transistor is estimated as a function of the ratio s of the gate leakage current to the gate voltage, and the degradation slope n determined from application of the single stress bias voltage.

In some embodiments, an apparatus comprises a circuit for measuring a gate leakage current of at least one transistor. A circuit is provided for providing heat to a gate of the at least one transistor. A circuit is provided for applying a single stress bias voltage to the at least one transistor at a given temperature for a stress period t. The stress bias voltage causes a 10% degradation in a drive current of the transistor at the given temperature within the stress period t. A processor estimates a negative bias temperature instability (NBTI) lifetime $\tau$ of the transistor based on the measured gate leakage current and a relationship between drive current degradation and time observed while applying the single stress bias voltage.

DETAILED DESCRIPTION

This description of the exemplary embodiments is intended to be read in connection with the accompanying drawings, which are to be considered part of the entire written description.

The literature has reported that NBTI degradation and gate leakage current mechanisms both are related to hole trapping, and that NBTI degradation in ultra thin oxide layers (as quantified by the fractional change in drive current) is proportional to the initial gate leakage current of the transistor. That is:

$$\Delta Id/Id \sim Jg, \quad (2)$$

where $\Delta Id/Id$ is the fractional change in drive current for a given drive voltage, and Jg is the gate leakage current.

Figure 3:
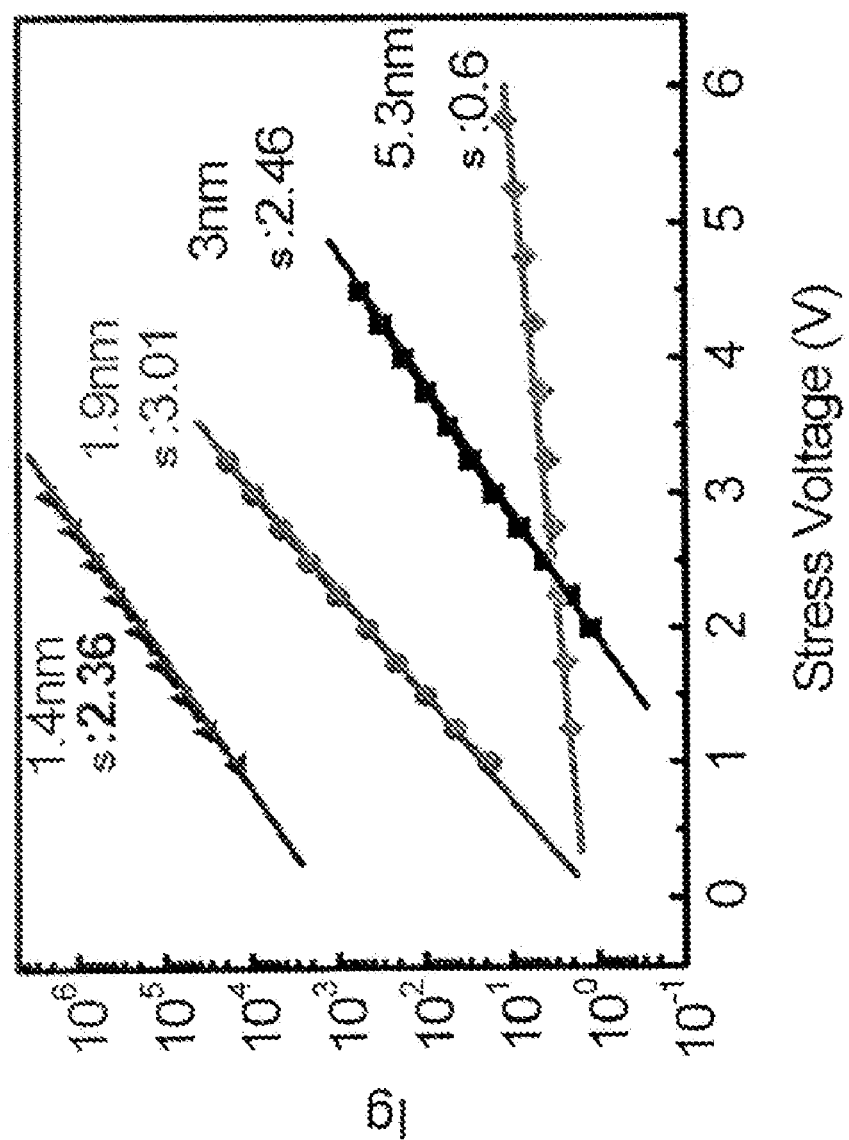
FIG. 3 is a diagram showing measurements of gate leakage current as a function of gate voltage for a plurality of gate geometries.

The inventors of the present application have developed an NBTI prediction method based on equation (2). Gate leakage current can be plotted against gate voltage for a variety of gate oxide thicknesses, as shown in FIG. 3. When the natural logarithm of gate leakage current for a given transistor is plotted against the voltage Vg between the gate electrode of that transistor and ground, the result is a substantially straight line having a slope s. Thus, $$Ig \sim \exp(sVg) \quad (3)$$

where Ig is the leakage current, Vg is the voltage between the gate and ground, and s is the slope of the Ig–Vg curve. The slope s varies with the gate oxide thickness.

NBTI can now be modeled by:

$$\Delta Id/Id \sim t^n \exp(sVg)\exp(Ea/KT) \quad (4)$$

where Ea=activation energy, K=Boltzmann's constant, (1.38×10−23 J/K), T=absolute temperature (the temperature of the gate oxide during operation) in Kelvin, and n is the degradation slope.

By definition, the NBTI lifetime is the length of time for $\Delta Id/Id$ to reach a value of 0.1. Inserting this value into equation (4) yields:

$$0.1 \sim \tau^n \exp(sVg)\exp(Ea/KT), \quad (5)$$

where $\tau$ is the NBTI lifetime, and Vg and T are the gate voltage and gate absolute temperature, respectively, during operation. Taking the natural logarithm of both sides yields:

$$\ln(0.1)=n*\ln(\tau)+sVg+Ea/KT \quad (6)$$

Solving for $\ln(\tau)$ yields:

$$\ln(\tau) \sim \ln 0.1/n - Ea/KTn - rVg, \quad (7)$$

where the ratio r=s/n.

Equation (7) suggests that the relationship between the natural logarithm of the NBTI lifetime and the stress voltage can be modeled with a linear plot.

Figure 1:
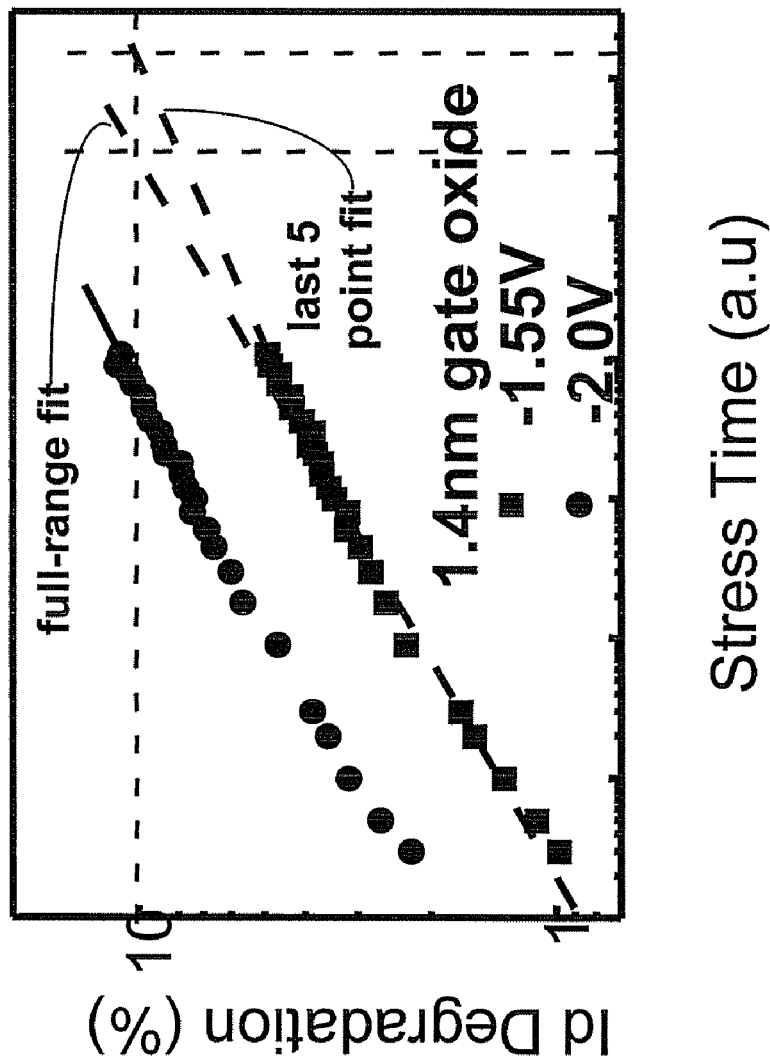
FIG. 1 is a diagram showing conventional accelerated measurement of drive current degradation over time for a plurality of stress voltages.
Figure 2:
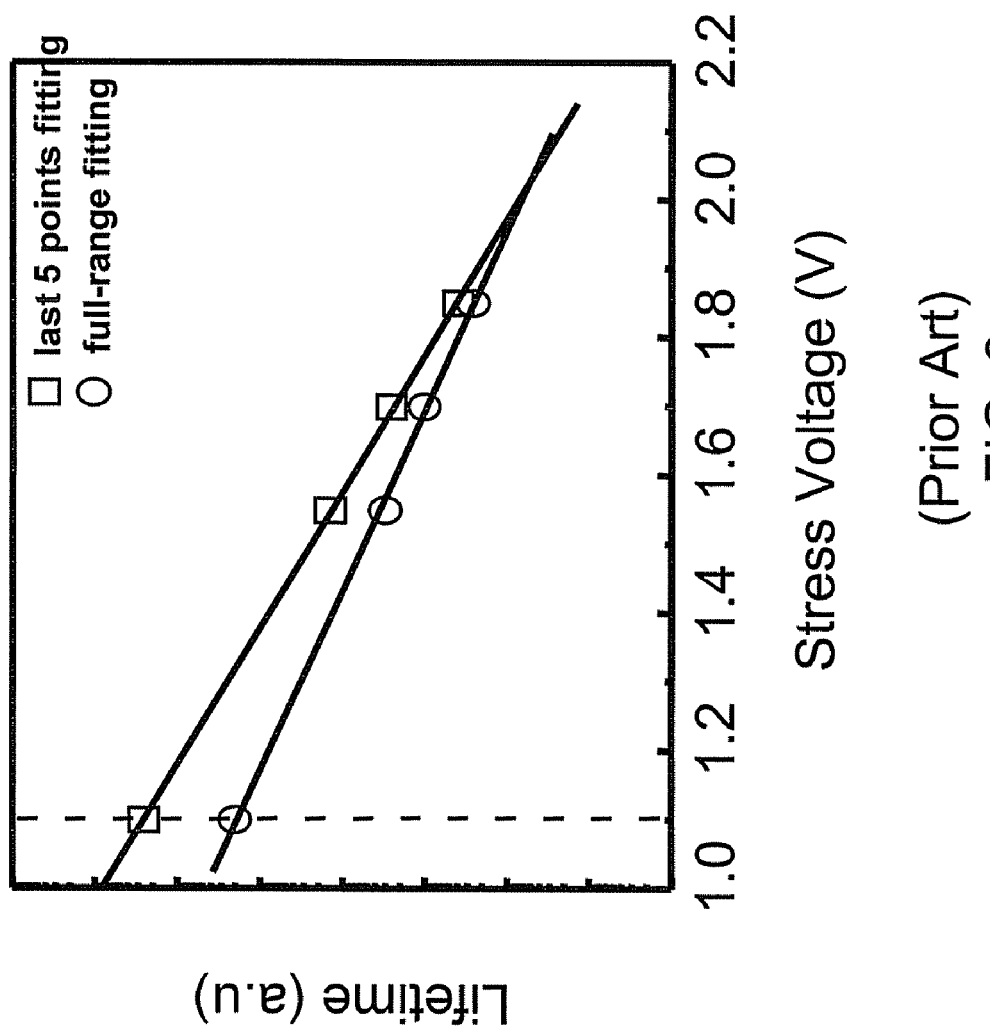
FIG. 2 is a diagram showing conventional estimation of NBTI lifetime based on accelerated measurements collected at four stress voltages, using two extrapolation methods.
Figure 4:
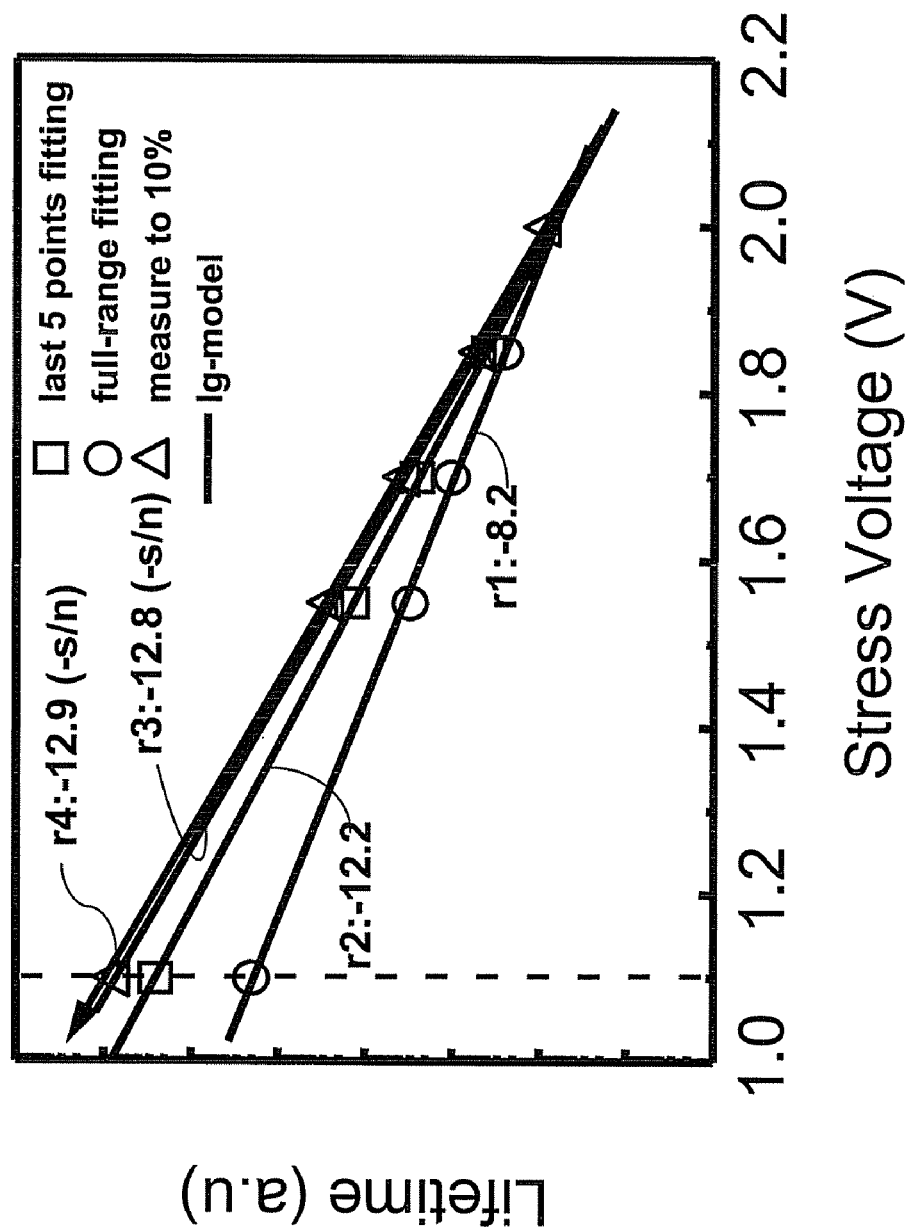
FIG. 4 is a diagram showing estimation of NBTI lifetime based on accelerated measurements collected at a single stress voltage, using two extrapolation methods.

FIG. 4 is a diagram showing how the Ig model of equation (7) can be applied. In FIG. 4, the regression lines from FIG. 2 are again presented (labeled r1 and r2), along with additional lines labeled r3 and r4. Line r3 represents an NBTI lifetime prediction based on drive current data measured at five stress voltage levels (−1.1, −1.55, −1.7, −1.85 and 2.0 Volts) for a transistor lot (e.g., a qualification lot). The line r3 represents transistors measured to real failure criteria (NBTI degradation of 10%) by −1.55, −1.7V −1.85V and −2.0V. The lines r1/r2 are produced using a different fitting methodology than lines r3/r4, but they are measured from different devices within the same lot. When the initial gate leakage current is mapped against the gate voltage, the ratio r for this transistor lot is calculated to be r=s/n=−12.8.

The line r4 represents the NBTI lifetime calculated using the Ig model of equation (7) and a ratio r=−12.9 based on the measured data collected at a single stress voltage, in this case the highest of the stress voltages used to provide the data for line r3. The stress voltage used to collect data for applying equation (7) to generating line r4 is sufficient to cause NBTI degradation of 10% in the transistors being measured during the stress test. Thus, comparing lines r3 and r4, line r3 is based on data collected at five different stress voltages, and line r4 is based on data collected at only one of the five stress voltages used to collect the data used to make line r3.

In this example, line r4 is based on the stress voltage 2.0 Volts. The lines r3 and r4 show that the Ig model of equation (7) provides results (line r4) consistent with empirical data (line r3). Testing over 5 lots at the 65 nanometer node demonstrated that the Ig model described herein provides results consistent with the conventional E-model (4-bias level testing).

Because the stress voltage used for the Ig model of equation (7) is sufficiently high to cause a 10% degradation in a drive current of the transistor at the given temperature within the period of the test (stress period t), no extrapolation is involved in determining the time to reach 10% NBTI degradation at that voltage. The 10% degradation is actually achieved during the test.

Figure 5:
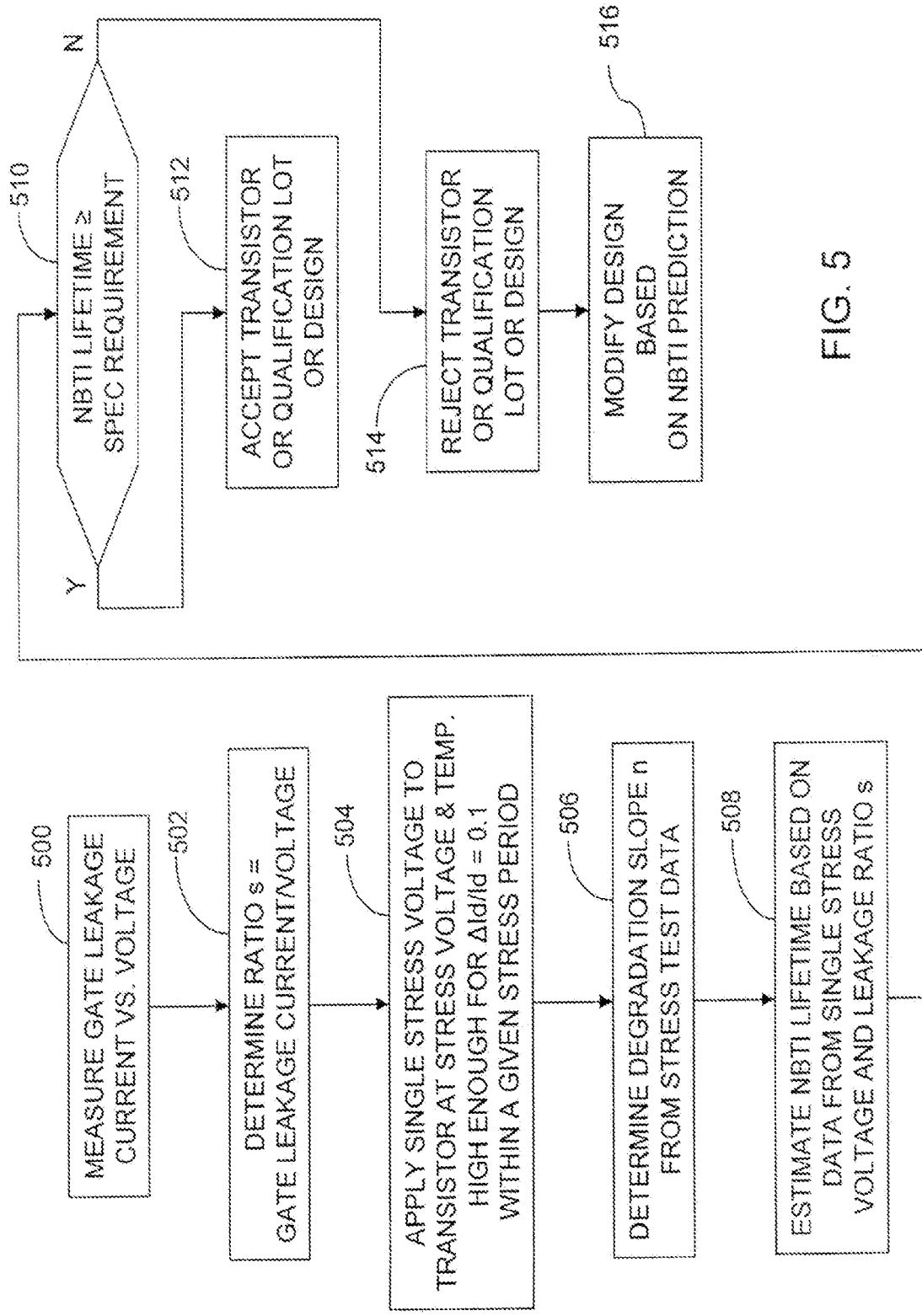
FIG. 5 is a flow chart diagram of an exemplary method for predicting NBTI lifetime.

FIG. 5 is a flow chart of an exemplary method.

At step 500, the gate leakage current is measured before the step of applying a single stress bias voltage.

At step 502, a gate leakage current of at least one transistor is divided by a corresponding gate voltage of the transistor to determine a ratio s thereof.

At step 504, a single stress bias voltage is applied to the at least one transistor at a given temperature for a stress period t. The stress bias voltage is sufficiently high to cause a 10% degradation in a drive current of the transistor at the given temperature within the stress period t. In some embodiments, the stress bias period is about 24 hours or less. One of ordinary skill understands that the stress temperature, stress bias voltage and stress period are related, so an appropriate combination of bias voltage and temperature can be selected to complete the stress period (i.e., reach 10% drive current degradation) within a reasonable test period range (e.g., one day, 2 days, one week, or whatever range of time period the engineer wants to select).

The at least one transistor may be a single transistor, a circuit (e.g., a ring oscillator circuit) comprising one or more transistors and additional circuit elements, or a sample from a qualification lot containing a plurality of transistors or circuits.

At step 506, a degradation slope n is determined, such that a change in the drive current of the transistor due to application of the single stress bias voltage is proportional to $t^n$. This determination may be made automatically by a processor, or graphically by plotting the measurements of the stress testing.

At step 508, a negative bias temperature instability (NBTI) lifetime τ of the transistor is estimated as a function of the ratio s of the gate leakage current to the gate voltage, and the degradation slope n determined from application of the single stress bias voltage. This estimate may be made using equation (7), for example.

At step 510, the estimated NBTI lifetime is compared to the NBTI lifetime required by the relevant specification for the transistor. If the specification requirement is met, step 512 is executed. If not, then step 514 is executed.

At step 512 the transistor or design or circuit or qualification lot of a product that includes the at least one transistor is accepted, if the calculated NBTI lifetime τ for the at least one transistor is greater than or equal to a threshold value.

At step 514 the transistor or design or circuit or qualification lot of a product that includes the at least one transistor is rejected, if the calculated NBTI lifetime τ is less than the threshold value.

At step 516 a transistor circuit design may optionally be modified based on the estimated NBTI lifetime. For example, the gate dielectric thickness may be adjusted to improve the NBTI lifetime, or a change may be made to the circuit design to reduce the operating temperature of the gate dielectric layer.

In the examples described above, a particular equation is used for estimating NBTI based on testing at a single stress bias voltage without extrapolation of the length of the stress period. One of ordinary skill can apply this method to other models based on other equations, in which test results from a single stress bias voltage (that causes a specified percentage degradation in drive current during the test) are used without extrapolating the length of the stress period.

Figure 6:
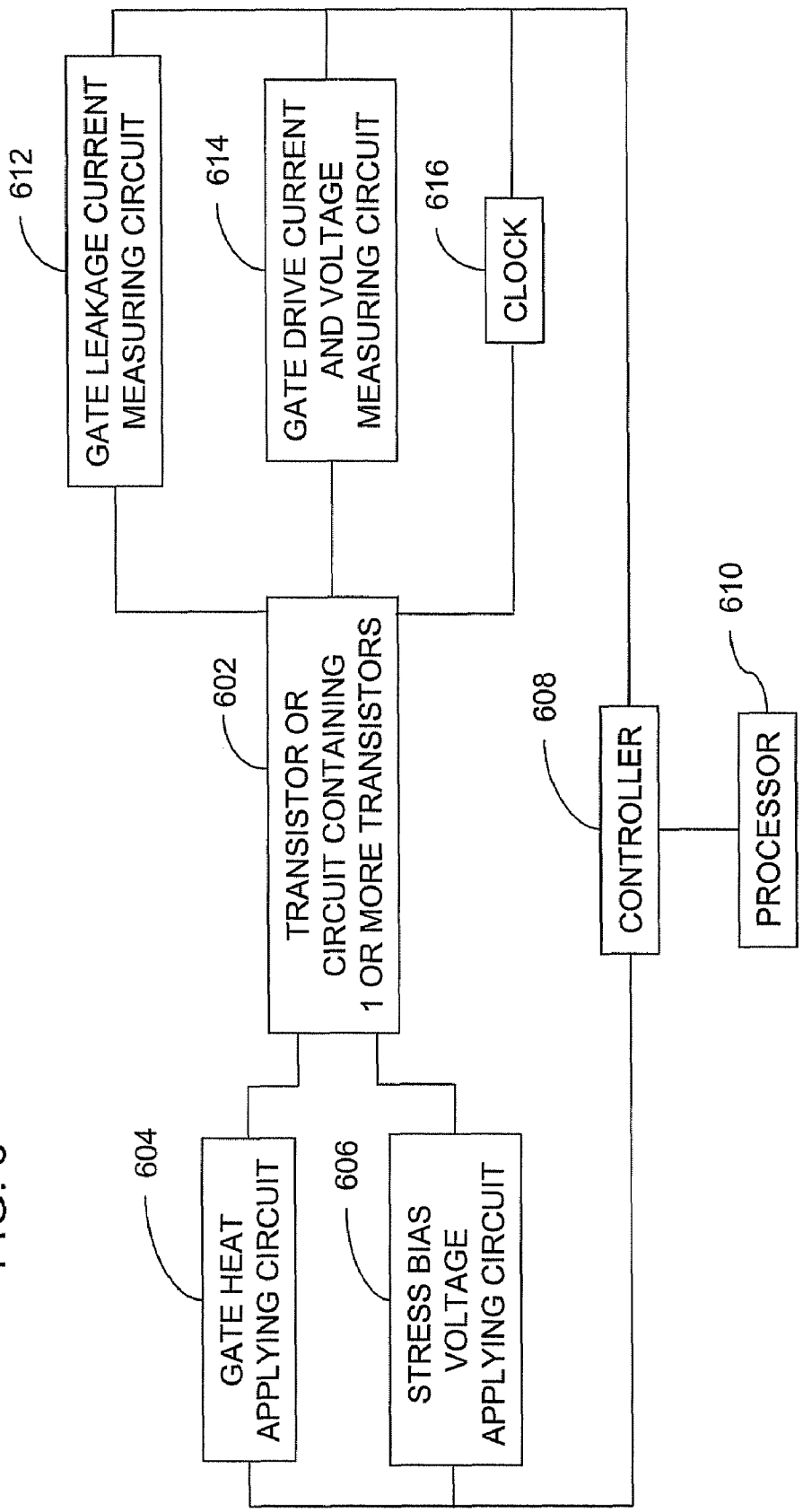
FIG. 6 is a block diagram of an exemplary apparatus for predicting NBTI lifetime.

FIG. 6 is a block diagram of an exemplary configuration for predicting the NBTI lifetime of a transistor or circuit 602.

A gate heat applying circuit 604 is connected to the gate electrode, to apply heat to the electrode of the transistor, or of the transistors if a circuit containing more than one transistor is tested. The circuit 604 may receive a temperature feedback signal from a temperature sensor (e.g., a thermocouple) near the gate of the transistor(s).

A stress bias voltage applying circuit 606 is connected to the gate electrode, to bias the gate.

A gate leakage current measuring circuit 612 is connected to measure the leakage current from the gate electrode to ground in response to a gate voltage.

A gate drive current and voltage measuring circuit measures the current flowing from drain to source in response to a drive voltage.

A clock 616 measures the length of time that elapses during the stress voltage testing. The clock 616 may be a component of the processor 610.

A controller 608 commands the circuits 604, 606, 612, 614 to perform the stress bias testing and to collect the data from the transistor(s)/circuit under test.

The processor 610 provides a user interface for the technician or engineer operating the system. The processor also performs computations, such as the NBTI lifetime calculation. The processor may be a desktop or laptop computer, for example.

One of ordinary skill in the art can readily select or design the components of FIG. 6. For example, circuits described in U.S. Pat. Nos. 6,456,104 or 6,731,179 may be used to provide heat and bias voltage, and measure the degradation in drive current. These patents are incorporated by reference as though set forth fully herein.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising the steps of:
   measuring a gate leakage current of at least one transistor;
   applying a single stress bias voltage to the at least one transistor at a given temperature for a stress period t, the stress bias voltage causing a 10% degradation in a drive current of the transistor at the given temperature within the stress period t;
   estimating a negative bias temperature instability (NBTI) lifetime τ of the transistor based on the measured gate leakage current and a relationship between the drive current degradation and the stress period t during the applying step.

2. The method of claim 1, wherein the applying step includes measuring the stress period t without extrapolating the stress period t.

3. The method of claim 1, wherein the NBTI lifetime τ is estimated by the expression:

$$\ln(\tau) - \ln(0.1)/n - E_a/KTn - rV_g,$$

where n is a degradation slope derived from measurements of degradation over time
during the applying step,
s is a ratio of gate leakage current to gate voltage,
r=s/n,
$E_a$=activation energy,
K=Boltzmann's constant, (1.38×10−23 J/K),
T=absolute temperature in Kelvins, and
$V_g$=gate voltage.

4. The method of claim 1, further comprising accepting a lot of a product that includes the at least one transistor, if the estimated NBTI lifetime τ for the at least one transistor is greater than or equal to a threshold value.

5. The method of claim 1, further comprising rejecting a lot of a product that includes the at least one transistor, if the estimated NBTI lifetime τ is less than a threshold value.

6. The method of claim 1, wherein the stress bias period is about 24 hours or less.

7. The method of claim 1, further comprising modifying a circuit design based on the estimated NBTI lifetime.

8. The method of claim 1, further comprising measuring the gate leakage current before the step of applying a single stress bias voltage.

9. A method comprising the steps of:
dividing a gate leakage current of at least one transistor by a corresponding gate voltage of the transistor to determine a ratio s thereof;
applying a single stress bias voltage to the at least one transistor at a given temperature for a stress period t, the stress bias voltage being sufficiently high to cause a 10% degradation in a drive current of the transistor at the given temperature within the stress period t;
determining a degradation slope n, such that a change in the drive current of the transistor due to application of the single stress bias voltage is proportional to $t^n$; and
estimating a negative bias temperature instability (NBTI) lifetime τ of the transistor as a function of the ratio s of the gate leakage current to the gate voltage, and the degradation slope n determined from application of the single stress bias voltage.

10. The method of claim 9, wherein the applying step includes measuring the stress period t without extrapolating the stress period t.

11. The method of claim 9, wherein the NBTI lifetime τ is estimated by the expression:

$$\ln(\tau) \sim \ln(0.1)/n - E_a/KTn - rV_g,$$

where r=s/n,
$E_a$=activation energy,
K=Boltzmann's constant, (1.38×10−23 J/K),
T=absolute temperature in Kelvins, and
$V_g$=gate voltage.

12. The method of claim 9, further comprising accepting a lot of a product that includes the at least one transistor, if the estimated NBTI lifetime τ for the at least one transistor is greater than or equal to a threshold value.

13. The method of claim 9, further comprising rejecting a lot of a product that includes the at least one transistor, if the estimated NBTI lifetime τ is less than a threshold value.

14. The method of claim 9, wherein the stress bias period is about 24 hours or less.

15. The method of claim 9, further comprising modifying a circuit design based on the estimated NBTI lifetime τ.

16. The method of claim 9, further comprising measuring the gate leakage current before the step of applying a single stress bias voltage.

17. Apparatus comprising:
a circuit for measuring a gate leakage current of at least one transistor;
a circuit for providing heat to a gate of the at least one transistor;
a circuit for applying a single stress bias voltage to the at least one transistor at a given temperature for a stress period t, the stress bias voltage causing a 10% degradation in a drive current of the transistor at the given temperature within the stress period t;
a processor for estimating a negative bias temperature instability (NBTI) lifetime τ of the transistor based on the measured gate leakage current and a relationship between the drive current degradation and the stress period t while applying the single stress bias voltage.

18. The apparatus of claim 17, wherein the processor estimates the NBTI lifetime τ by the expression:

$$\ln(\tau) \sim \ln(0.1)/n - E_a/KTn - rV_g,$$

where n is a degradation slope derived from measurements of degradation over time while applying the single stress bias voltage,
s is a ratio of gate leakage current to gate voltage,
r=s/n,
$E_a$=activation energy,
K=Boltzmann's constant, (1.38×10−23 J/K),
T=absolute temperature in Kelvins, and
$V_g$=gate voltage.

19. The apparatus of claim 17, wherein the processor is programmed to make a decision to accept a lot of a product that includes the at least one transistor, if the estimated NBTI lifetime τ for the at least one transistor is greater than or equal to a threshold value.

20. The apparatus of claim 17, wherein the processor is programmed to make a decision to reject a lot of a product that includes the at least one transistor, if the estimated NBTI lifetime τ is less than a threshold value.

* * * * *